United States Patent
Isomura et al.

(10) Patent No.: US 9,659,361 B2
(45) Date of Patent: May 23, 2017

(54) MEASURING APPARATUS THAT GENERATES POSITIONAL DEVIATION DISTRIBUTION OF A PATTERN ON A TARGET OBJECT

(71) Applicant: NuFlare Technology, Inc., Yokohama (JP)

(72) Inventors: Ikunao Isomura, Kanagawa (JP); Nobutaka Kikuiri, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/529,358

(22) Filed: Oct. 31, 2014

(65) Prior Publication Data

US 2015/0125067 A1    May 7, 2015

(30) Foreign Application Priority Data

Nov. 6, 2013  (JP) .................................. 2013-230593

(51) Int. Cl.
*G06T 7/00* (2006.01)
*H01L 21/66* (2006.01)

(52) U.S. Cl.
CPC ............ *G06T 7/001* (2013.01); *G06T 7/0008* (2013.01); *H01L 22/12* (2013.01);
(Continued)

(58) Field of Classification Search
CPC .. H01L 22/12; G01N 21/9501; G01N 21/956; G06T 2207/30148; G06T 7/001; G06T 7/0008; G06T 7/0006
See application file for complete search history.

(56) References Cited

U.S. PATENT DOCUMENTS

2007/0156379 A1* 7/2007 Kulkarni et al. ............... 703/14
2008/0037860 A1  2/2008 Yamashita
(Continued)

FOREIGN PATENT DOCUMENTS

JP         3824542       9/2006
JP      2008-039712 A    2/2008
(Continued)

OTHER PUBLICATIONS

U.S. Appl. No. 14/529,297, filed Oct. 31, 2014, Isomura, et al.
(Continued)

*Primary Examiner* — Utpal Shah
(74) *Attorney, Agent, or Firm* — Oblon, McClelland, Maier & Neustadt, L.L.P.

(57) ABSTRACT

A measuring apparatus includes an optical image input unit to input optical image data of a figure pattern obtained by a pattern inspection apparatus, which inspects defects of a pattern on a target object to be inspected by scanning an inspection region of the target object, from the pattern inspection apparatus, a design data input unit to input design data of the pattern on the target object, a reference image generation unit to generate reference image data to be compared with the optical image data, by performing image development of the design data, a positional deviation distribution generation unit to generate positional deviation distribution by measuring a positional deviation amount of the pattern on the target object, by using the optical image data obtained from the pattern inspection apparatus and the reference image data having been generated, and an output unit to output generated positional deviation distribution of the pattern.

9 Claims, 8 Drawing Sheets

(52) U.S. Cl.
CPC ............... *G06T 2207/10016* (2013.01); *G06T 2207/20021* (2013.01); *G06T 2207/30148* (2013.01)

(56) References Cited

U.S. PATENT DOCUMENTS

| | | | |
|---|---|---|---|
| 2008/0075325 A1* | 3/2008 | Otani | ............... G01C 15/002 382/106 |
| 2013/0250095 A1 | 9/2013 | Inoue et al. | |
| 2014/0294283 A1 | 10/2014 | Takeda et al. | |
| 2014/0307945 A1 | 10/2014 | Yasui et al. | |

FOREIGN PATENT DOCUMENTS

| | | |
|---|---|---|
| JP | 2013-64632 | 4/2013 |
| KR | 10-2010-0053442 | 5/2010 |

OTHER PUBLICATIONS

U.S. Appl. No. 14/607,483, filed Jan. 28, 2015, Kikuiri.
Office Action issued Mar. 11, 2016 in Korean Patent Application No. 10-2014-0152354 (with English Translation).
Decision of Refusal issued on Sep. 23, 2016 in Korean Patent Application No. 10-2014-0152354 with English translation.
Decision of Refusal issued on Oct. 28, 2016 in Korean Patent Application No. 10-2014-152354 with English translation.

\* cited by examiner

MEASURING APPARATUS THAT GENERATES POSITIONAL DEVIATION DISTRIBUTION OF A PATTERN ON A TARGET OBJECT

CROSS-REFERENCE TO RELATED APPLICATION

This application is based upon and claims the benefit of priority from the prior Japanese Patent Application No. 2013-230593 filed on Nov. 6, 2013 in Japan, the entire contents of which are incorporated herein by reference.

BACKGROUND OF THE INVENTION

Field of the Invention

The present invention relates to a measuring apparatus. Specifically, for example, it relates to a measuring apparatus that measures a pattern by using data generated by an inspection apparatus which inspects a pattern defect by acquiring an optical image of the pattern image by laser light irradiation.

Description of Related Art

In recent years, with the advance of high integration and large capacity of a large scale integrated circuit (LSI), the line width (critical dimension) required for circuits of semiconductor elements is becoming progressively narrower. Such semiconductor elements are manufactured by exposing and transferring a pattern onto a wafer to form a circuit by means of a reduced projection exposure apparatus known as a stepper while using an original or "master" pattern (also called a mask or a reticle, and hereinafter generically referred to as a mask) with a circuit pattern formed thereon. Then, in fabricating a mask used for transferring such a fine circuit pattern onto a wafer, a pattern writing apparatus capable of writing or "drawing" fine circuit patterns by using electron beams needs to be employed. Pattern circuits may be written directly on the wafer by the pattern writing apparatus. Also, a laser beam writing apparatus that uses laser beams in place of electron beams for writing a pattern is under development.

Since LSI manufacturing requires a tremendous amount of manufacturing cost, it is crucial to improve its yield. However, as typified by a 1-gigabit DRAM (Dynamic Random Access Memory), the scale of a pattern configuring an LSI has been changing from on the order of submicrons to nanometers. One of major factors that decrease the yield of the LSI manufacturing is a pattern defect of a mask used when, by the photolithography technology, exposing and transferring a fine pattern onto a semiconductor wafer. In recent years, with miniaturization of dimensions of an LSI pattern formed on a semiconductor wafer, dimensions to be detected as a pattern defect have become extremely small. Thus, the pattern inspection apparatus which inspects a defect of a transfer mask used in manufacturing LSI needs to be highly precise.

As an inspection method, there is known a method of comparing an optical image of a pattern formed on a target object or "sample", such as a lithography mask, imaged at a predetermined magnification by using a magnification optical system, with design data or an optical image obtained by imaging the same pattern on the target object. For example, the following is known as pattern inspection methods: the "die-to-die inspection" method that compares data of optical images of identical patterns at different positions on the same mask; and the "die-to-database inspection" method that inputs, into the inspection apparatus, writing data (design pattern data) generated by converting pattern-designed CAD data into a writing apparatus specific format to be input to the writing apparatus when a pattern is written on the mask, generates design image data (reference image) based on the input writing data, and compares the generated design image data with an optical image (serving as measurement data) obtained by imaging the pattern. According to the inspection method for use in the inspection apparatus, a target object is placed on the stage so that a light flux may scan the object by the movement of the stage in order to perform an inspection. Specifically, the target object is irradiated with a light flux from the light source by the illumination optical system. Light transmitted through the target object or reflected therefrom is focused on a sensor through the optical system. An image captured by the sensor is transmitted as measurement data to the comparison circuit. In the comparison circuit, after performing position adjustment of images, measurement data and reference data are compared with each other in accordance with an appropriate algorithm. If there is no matching between the compared data, it is determined that there exists a pattern defect.

In pattern inspection, in addition to inspecting a pattern defect (shape defect), it is also required to measure a pattern critical dimension (CD) deviation and a pattern positional deviation. Conventionally, measuring a pattern critical dimension (CD) deviation and a pattern positional deviation has been performed, separately from inspecting a pattern defect, by arranging a target object (actual mask) to be inspected in a dedicated measuring apparatus. In a pattern defect inspection apparatus, all images of a target object to be inspected and their position information are obtained and stored in order to find a defect. Therefore, if the data obtained by the pattern defect inspection can be used for measuring a pattern positional deviation and the like, a costwise and inspection timewise significant advantage can be achieved. However, conventionally, data obtained by a pattern defect inspection apparatus has been less than thoroughly utilized.

With regard to measurement of a CD deviation, there is proposed an inspection method in which a pattern line width in an image obtained for each preset region is measured, a difference from design data is calculated, and an average of all line width differences in a region is compared with a threshold value, so that a line width abnormal region is found as a CD error (dimension defect) (refer to, e.g., Japanese Patent No. 3824542).

BRIEF SUMMARY OF THE INVENTION

According to one aspect of the present invention, a measuring apparatus includes an optical image input unit configured to input optical image data of a figure pattern obtained by a pattern inspection apparatus, which inspects a defect of a pattern formed on a target object to be inspected by scanning an inspection region of the target object to be inspected, from the pattern inspection apparatus; a design data input unit configured to input design data of the pattern formed on the target object to be inspected; a reference image generation unit configured to generate reference image data to be compared with the optical image data, by carrying out image development of the design data; a positional deviation distribution generation unit configured to generate positional deviation distribution by measuring a positional deviation amount of the pattern on the target object to be inspected, by using the optical image data obtained from the pattern inspection apparatus and the reference image data having been generated; and an output unit configured to output generated positional deviation distribution of the pattern on the target object to be inspected, wherein the measuring apparatus is arranged independently from the pattern inspection apparatus.

According to another aspect of the present invention, a measuring method includes inputting optical image data of a figure pattern obtained when a pattern inspection apparatus, which inspects a defect of a pattern formed on a target object to be inspected, scans an inspection region of the target object to be inspected; inputting design data of the pattern formed on the target object to be inspected by a measuring apparatus arranged independently from the pattern inspection apparatus; generating reference image data to be compared with the optical image data, by carrying out image development of the design data, by using the measuring apparatus; generating positional deviation distribution by the measuring apparatus, by measuring a positional deviation amount of the pattern on the target object to be inspected, by using the optical image data obtained from the pattern inspection apparatus and the reference image data having been generated; and outputting generated positional deviation distribution of the pattern on the target object to be inspected, from the measuring apparatus.

DETAILED DESCRIPTION OF THE INVENTION

First Embodiment

In the first embodiment, there will be described a measuring apparatus that can measure a positional deviation of a pattern formed on a target object to be inspected, using data obtained by a pattern inspection apparatus.

Figure 1:
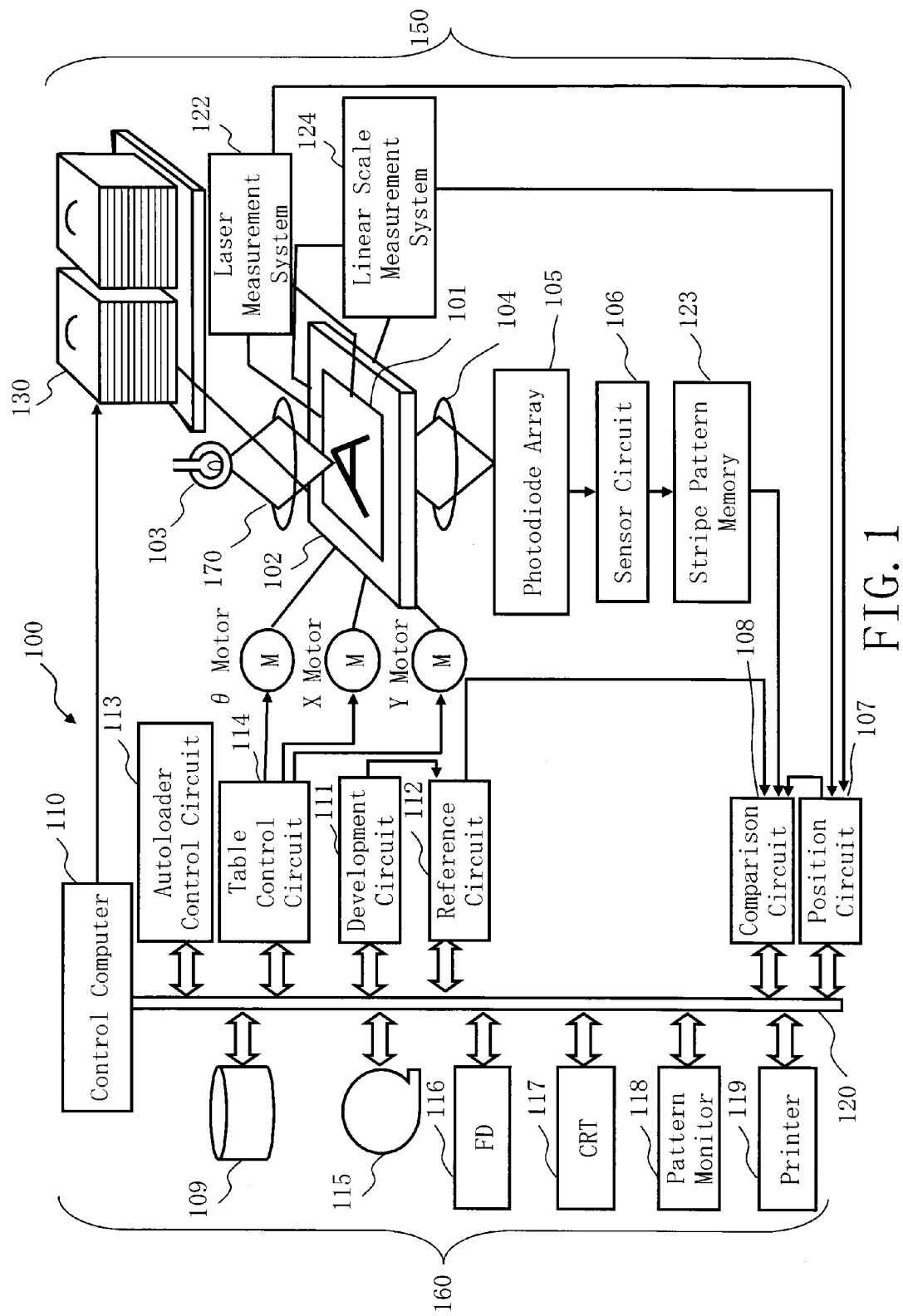
FIG. 1 shows the configuration of a pattern inspection apparatus according to a first embodiment.

FIG. 1 shows the configuration of a pattern inspection apparatus according to the first embodiment. In FIG. 1, an inspection apparatus 100 that inspects a defect of a pattern formed on a target object such as a mask includes an optical image acquisition unit 150 and a control system circuit 160 (control unit).

The optical image acquisition unit 150 includes a light source 103, an illumination optical system 170, an XYθ table 102 arranged movably, a magnification optical system 104, a photodiode array 105 (an example of a sensor), a sensor circuit 106, a stripe pattern memory 123, a linear scale measurement system 124, and a laser measurement system 122. A target object 101 is placed on the XYθ table 102. The target object 101 is, for example, an exposure photo mask used for transferring a pattern to a wafer. A pattern composed of a plurality of figure patterns to be inspected is formed on the photo mask. The target object 101 is placed on the XYθ table 102 with its pattern formation side facing down, for example.

In the control system circuit 160, a control computer 110 is connected, through a bus 120, to a position circuit 107, a comparison circuit 108, a development circuit 111, a reference circuit 112, an autoloader control circuit 113, a table control circuit 114, a magnetic disk drive 109, a magnetic tape drive 115, a flexible disk drive (FD) 116, a CRT 117, a pattern monitor 118, and a printer 119. Moreover, the sensor circuit 106 is connected to the stripe pattern memory 123 which is connected to the comparison circuit 108. The XYθ table 102 is driven by an X-axis motor, a Y-axis motor, and a θ-axis motor. The XYθ table 102 serves as an example of the stage.

In the inspection apparatus 100, an inspection optical system of large magnification is composed of the light source 103, the XYθ table 102, the illumination optical system 170, the magnification optical system 104, the photodiode array 105, and the sensor circuit 106. The XYθ table 102 is driven by the table control circuit 114 under the control of the control computer 110. The XYθ table 102 can be moved by a drive system such as a three-axis (X, Y, and θ) motor, which drives in the directions of x, y, and θ. For example, a step motor can be used as each of these X, Y, and θ motors. The XYθ table 102 is movable in the horizontal direction and a rotation direction by the X-, Y-, and θ-axis motors. The movement position of the XYθ table 102 is measured by the linear scale measurement system 124, and supplied to the position circuit 107. The movement position of the target object 101 placed on the XYθ table 102 is measured by the laser measurement system 122, and supplied to the position circuit 107.

FIG. 1 shows configuration elements necessary for describing the first embodiment. It should be understood that other configuration elements generally necessary for the inspection apparatus 100 may also be included therein.

Figure 2:
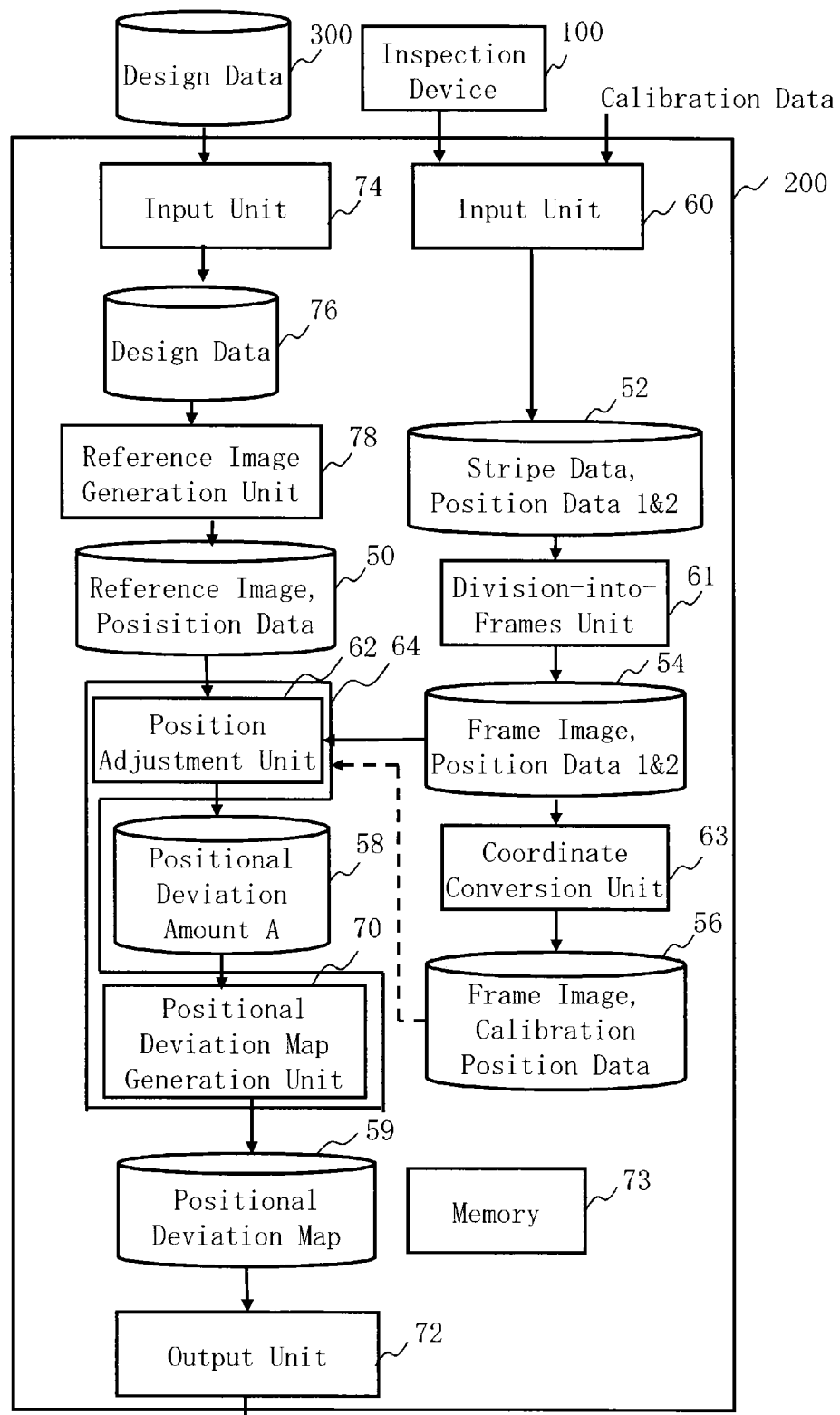
FIG. 2 shows a configuration of a measuring apparatus according to the first embodiment.

FIG. 2 shows a configuration of a measuring apparatus according to the first embodiment. In FIG. 2, a measuring apparatus 200 is arranged independently from the inspection apparatus 100 described above. In the measuring apparatus 200, there are arranged storage devices 50, 52, 54, 56, 58, 59, and 76, such as magnetic disk drives, input units 60 and 74, a division-into-frames unit 61, a coordinate conversion unit 63, a positional deviation distribution generation unit 64, an output unit 72, a memory 73, and a reference image generation unit 78. Functions, such as the input units 60 and 74, the division-into-frames unit 61, the coordinate conversion unit 63, the positional deviation distribution generation unit 64, the output unit 72, and the reference image generation unit 78 may be configured by software such as a program causing a computer to implement these functions or by hardware such as an electronic circuit. Alternatively, they may be configured by a combination of hardware and software. If any of the functions such as the input units 60 and 74, the division-into-frames unit 61, the coordinate conversion unit 63, the positional deviation distribution generation unit 64, the output unit 72, and the reference image generation unit 78 is configured by software, input data necessary for the function configured by software, or a calculated result is stored in the memory 73 each time.

The positional deviation distribution generation unit 64 includes a position adjustment unit 62 and a positional deviation map generation unit 70. Functions, such as the position adjustment unit 62 and the positional deviation map generation unit 70 may be configured by software such as a program causing a computer to implement these functions or by hardware such as an electronic circuit. Alternatively, they may be configured by a combination of hardware and software. If either of the functions such as the position adjustment unit 62 and the positional deviation map generation unit 70 is configured by software, input data necessary for the function configured by software, or a calculated result is stored in the memory 73 each time.

First, data is generated by the inspection apparatus 100. Specifically, it will be described below.

In the optical image capturing step (also referred to as a scanning step or an optical image acquisition step), the optical image acquisition unit 150 acquires an optical image of a photomask used as the target object 101. Specifically, it operates as described below.

Patterns formed on the target object 101 are irradiated by a laser light (e.g., a DUV light) being an inspection light of a wavelength of or below the ultraviolet region emitted from the suitable light source 103 through the illumination optical system 170. Light transmitted through the target object 101 is focused as an optical image on the photodiode array 105 (an example of a sensor) via the magnification optical system 104, and enters thereinto. It is preferable to use, for example, a TDI (Time Delay Integration) sensor and the like as the photodiode array 105.

Figure 3:
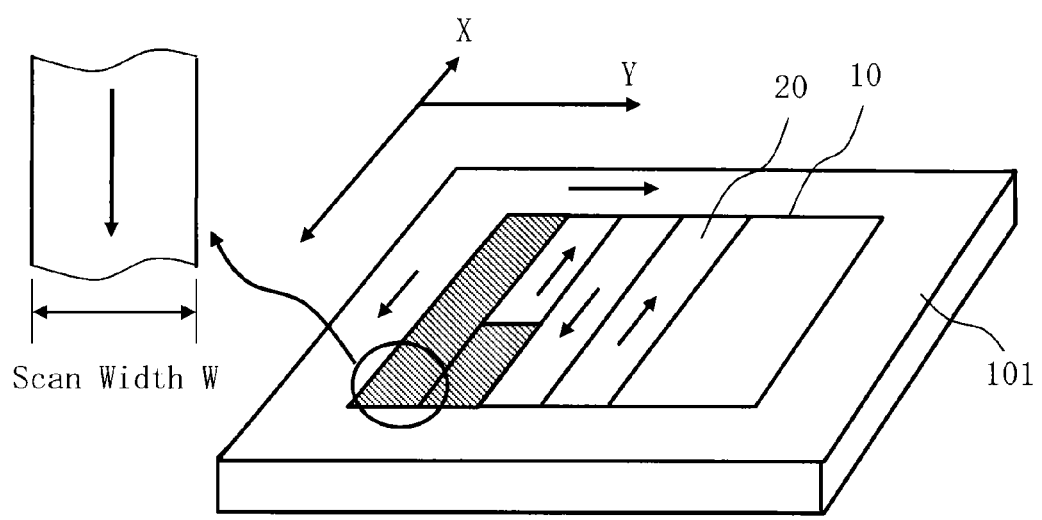
FIG. 3 is a conceptual diagram illustrating an inspection region according to the first embodiment.

FIG. 3 is a conceptual diagram illustrating an inspection region according to the first embodiment. As shown in FIG. 3, an inspection region 10 (entire inspection region) of the target object 101 is virtually divided into a plurality of strip-shaped inspection stripes 20 each having a scan width W in the y direction, for example. In the inspection apparatus 100, an image (stripe region image) is acquired for each inspection stripe 20. With respect to each of the inspection stripes 20, an image of a figure pattern arranged in a stripe region concerned is captured using a laser light, in the longitudinal direction (the x direction) of the stripe region concerned. Optical images are acquired by the photodiode array 105 moving relatively in the x direction continuously by the movement of the XYθ table 102. That is, the photodiode array 105 continuously captures optical images each having a scan width W as shown in FIG. 3. In other words, the photodiode array 105, being an example of a sensor, captures optical images of patterns formed on the target object 101 by using an inspection light, while moving relatively to the XYθ table 102 (stage). According to the first embodiment, after capturing an optical image in one inspection stripe 20, the photodiode array 105 moves in the y direction to the position of the next inspection stripe 20 and similarly captures another optical image having the scan width W continuously while moving in the direction reverse to the last image capturing direction. Thereby, the image capturing is repeated in the forward (FWD) to backward (BWD) direction, namely going in the reverse direction when advancing and returning.

The direction of the image capturing is not limited to repeating the forward (FWD) and backward (BWD) movement. It is also acceptable to capture an image from a fixed one direction. For example, repeating FWD and FWD may be sufficient, and alternatively, BWD and BWD may also be sufficient.

A pattern image focused on the photodiode array 105 is photoelectrically converted by each light receiving element of the photodiode array 105, and further analog-to-digital (A/D) converted by the sensor circuit 106. Then, pixel data is stored in the stripe pattern memory 123 for each inspection stripe 20. When capturing an image of the pixel data (stripe region image), a dynamic range where the case of 100% incident illumination light quantity is the maximum gray level, for example, is used as the dynamic range of the photodiode array 105. Then, the stripe region image is sent to the comparison circuit 108, with the data indicating the position of the photo mask 101 on the XYθ table 102 output from the position circuit 107. Measurement data (pixel data) is 8-bit unsigned data, for example, and indicates a gray level (light intensity) of brightness of each pixel. The stripe region image input into the comparison circuit 108 is stored in a memory (not shown).

In the division-into-frames step, in the comparison circuit 108, a stripe region image (optical image) is divided into a plurality of frame images (optical images) by a predetermined size (for example, by the same width as the scan width W) in the x direction, in each inspection stripe 20. For example, it is divided into frame regions each having 512×512 pixels. In other words, the stripe region image of each inspection stripe 20 is divided into a plurality of frame images (optical images) by the width being the same as that of the inspection stripe 20, for example, by the scan width W. By this processing, a plurality of frame images (optical images) corresponding to a plurality of frame regions can be acquired. A plurality of frame images are stored in a memory (not shown). As described above, data of one image (measured image) to be compared with the other, for inspection, is generated.

On the other hand, in the reference image generation step, first, the development circuit 111 reads design data from the magnetic disk drive 109 through the control computer 110, converts each figure pattern in each frame region defined in the read design data into image data of binary values or multiple values, and sends the image data to the reference circuit 112.

Here, figures defined in the design data are, for example, rectangles or triangles as basic figures. For example, figure data is stored in which the shape, size, position, and the like of each pattern figure are defined as information, such as coordinates (x, y) at a reference position of a figure, the length of a side, a figure code being an identifier for identifying a figure type, such as a rectangle, triangle, or the like.

When information on a design pattern serving as the figure data is input to the development circuit 111, it is developed into data of each figure. Then, a figure code, figure dimensions and the like indicating the figure shape of the figure data are interpreted. Then, design image data of binary values or multiple values is developed and output as a pattern arranged in a grid which is a unit of a predetermined quantization size grid. In other words, design data is loaded, and an occupancy rate of a figure in a design pattern is calculated for each grid obtained by virtually dividing an inspection region into grids in which a predetermined dimension is a unit. Then, occupancy rate data of n bits is output. For example, it is preferable that one grid is set as one pixel. If a resolution of $1/2^8$ ($=1/256$) is given to one pixel, an occupancy rate in a pixel is calculated by assigning a small region of $1/256$, for an amount equal to the region of a figure arranged in a pixel. Then, it is output as occupancy rate data of 8 bits to the reference circuit 112.

Next, the reference circuit 112 performs appropriate filter processing on design image data which is figure image data having been sent.

Figure 4:
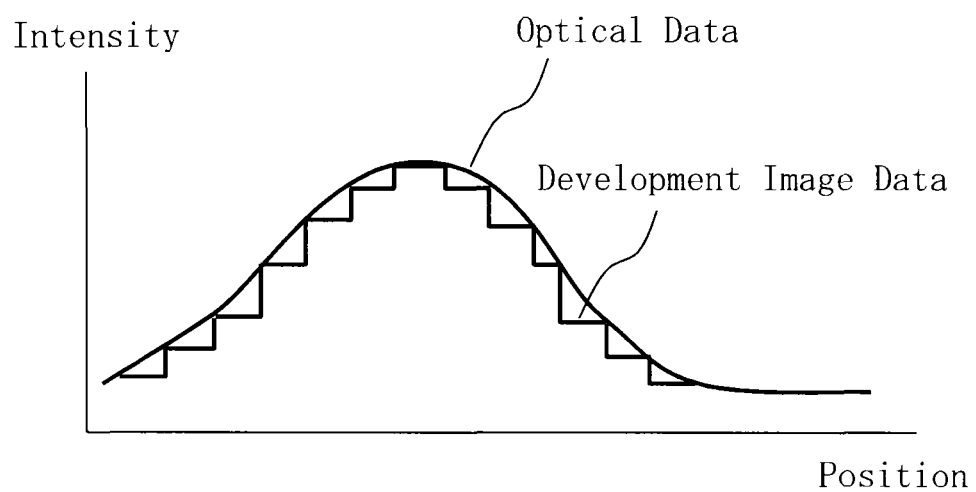
FIG. 4 shows filter processing according to the first embodiment.

FIG. 4 shows filter processing according to the first embodiment. Since the measurement data being an optical image obtained from the sensor circuit 106 is in a state affected by the filtering due to resolution characteristics of the magnification optical system 104, an aperture effect of the photodiode array 105, and/or the like, in other words, in an analog state continuously changing, it is possible to be matched with measurement data by also performing filtering processing on design image data being image data of the design side whose image intensity (gray value) is represented by a digital value. In this way, a design image (reference image) is generated to be compared with a frame image (optical image). The generated reference image is output to the comparison circuit 108 to be stored in a memory (not shown). As described above, data of image (reference image) being the other side to be compared for inspection is generated. It should be understood that position data of the reference image data is also output, with the reference image data, to the comparison circuit 108.

In the comparison step, the comparison circuit 108 compares a frame image and its corresponding reference image, for each pixel, based on predetermined determination conditions. That is, the comparison circuit 108 compares the images for each pixel, based on predetermined determination conditions in order to determine the existence or nonexistence of a defect, such as a shape defect. As the determination conditions, for example, a predetermined algorithm is used, based on which a frame image and its corresponding reference image are compared with each other for each pixel in order to determine whether a defect exists or not. Then, the comparison result is output, and specifically may be output to the magnetic disk drive 109, the magnetic tape drive 115, the flexible disk drive (FD) 116, the CRT 117, and the pattern monitor 118, or output from the printer 119. Thereby, highly precise inspection for pattern defects can be performed.

While, in the example described above, die-to-database inspection has been explained, it is also preferable to perform die-to-die inspection. In the die-to-die inspection, a plurality of dies on each of which the same pattern is formed in the inspection region 10 of the target object 101.

In the optical image capturing step (also referred to as a scanning step or an optical image acquisition step), the optical image acquisition unit 150 acquires an optical image of a photomask used as the target object 101. The contents of the optical image capturing step are the same as those of the die-to-database inspection. Consequently, similarly to the die-to-database inspection, pixel data is stored in the stripe pattern memory 123 for each inspection stripe 20. Then, the stripe region image is sent to the comparison circuit 108, with the data indicating the position of the photo mask 101 on the XYθ table 102 output from the position circuit 107. Measurement data (pixel data) is 8-bit unsigned data, for example, and indicates a gray level (light intensity) of brightness of each pixel. The stripe region image input into the comparison circuit 108 is stored in a memory (not shown).

In die-to-die inspection, one of the same patterns arranged in one of different dies and the other of the same patterns arranged in the other of the different dies have been imaged in the one stripe pattern data. Therefore, by performing dividing into frames described below, it is divided into frame images (optical images) each for each die.

In the division-into-frames step, in the comparison circuit 108, a stripe region image (optical image) is divided into a plurality of frame images (optical images) by a predetermined size (for example, the same width as the scan width W) in the x direction, for each inspection stripe 20. For example, it is divided into frame images each having 512× 512 pixels. In other words, the stripe region image of each inspection stripe 20 is divided into a plurality of frame images (optical images) by the same width as that of the inspection stripe 20, for example, by the scan width W. Thereby, a plurality of frame images (optical images) corresponding to a plurality of frame regions are acquired. A plurality of frame images are stored in a memory (not shown). Thereby, as described above, data of a die image (measured image) and data of the other die image (measured image) which are to be compared with each other for inspection are generated.

In the comparison step, the comparison circuit 108 compares the data of one die image (measured image) and the data of the other die image (measured image), for each pixel, based on predetermined determination conditions. That is, the comparison circuit 108 compares the data for each pixel, based on predetermined determination conditions in order to determine the existence or nonexistence of a defect, such as a shape defect. As the determination conditions, for example, a predetermined algorithm is used, based on which data of one die image and data of the other die image are compared for each pixel in order to determine whether a defect exists or not. Then, the comparison result is output, and specifically may be output to the magnetic disk drive 109, the magnetic tape drive 115, the flexible disk drive (FD) 116, the CRT 117, and the pattern monitor 118, or output from the printer 119. Thereby, highly precise inspection for pattern defects can be performed.

According to the first embodiment, optical image data generated in the inspection apparatus 100 is output for use in the measuring apparatus.

Figure 5:
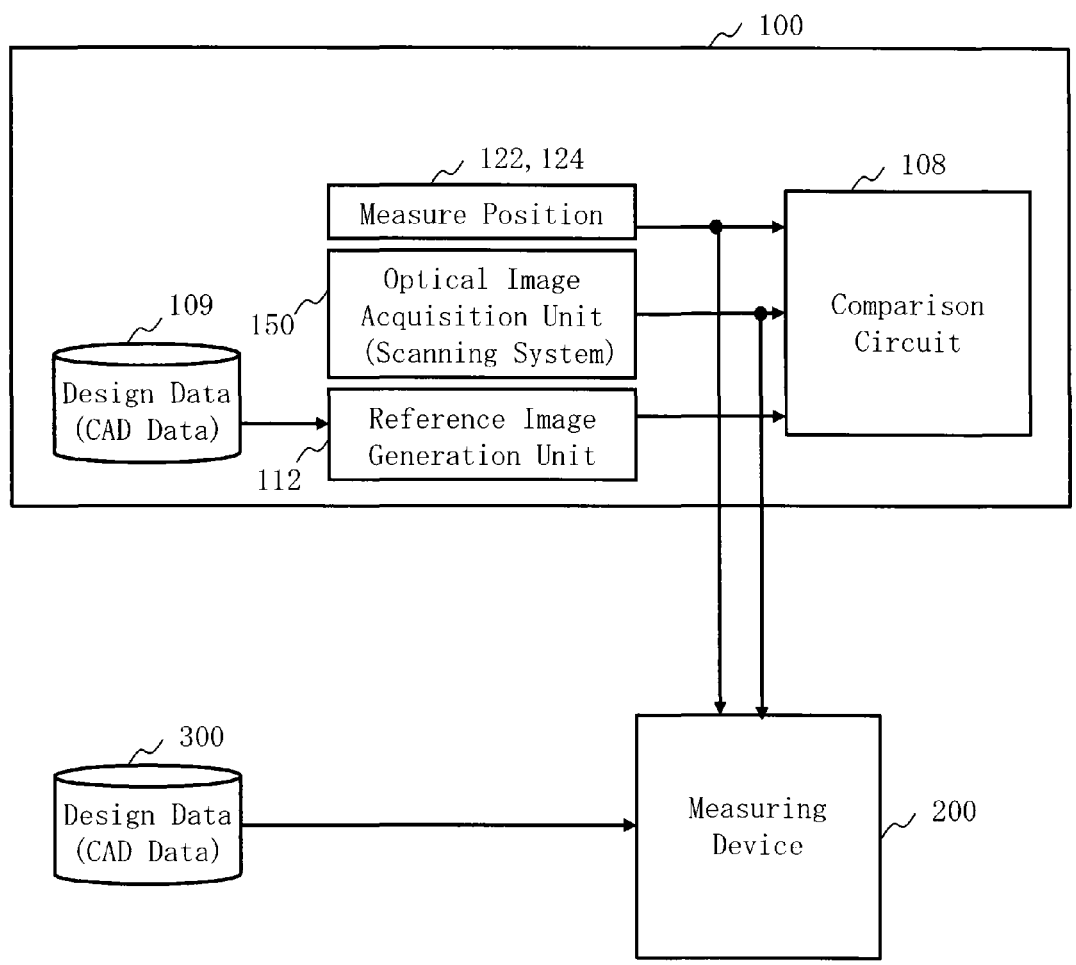
FIG. 5 is a conceptual diagram showing a relation between a measuring apparatus and an inspection apparatus according to the first embodiment.

FIG. 5 is a conceptual diagram showing a relation between a measuring apparatus and an inspection apparatus according to the first embodiment. As described above, in the inspection apparatus 100, the optical image acquisition unit 150 acquires optical image data (stripe data) for each stripe of the target object 101. Simultaneously, the linear scale measurement system 124 measures the position (x, y coordinates) of the XYθ table 102. Moreover, the laser measurement system 122 measures the position (x, y coordinates) of the target object 101 placed on the XYθ table 102. According to the first embodiment, optical image data (stripe data) with position data is input from the inspection apparatus 100. While, in the first embodiment, position data of a plurality of different coordinates, such as position data 1 of the coordinate system measured by the linear scale measurement system 124, and position data 2 of the coordinate system measured by the laser measurement system 122 are input as position data of the optical image data, it is not limited thereto. It is acceptable to use position data of one coordinate system. Operations performed in the measuring apparatus 200 will be described hereafter.

In the optical image data input step, the input unit 60 (an example of an optical image data input unit) inputs optical image data of a figure pattern obtained when the inspection apparatus 100 scans the inspection region 10 of the target object 101 to be inspected. Moreover, the input unit 60 further inputs position data of the optical image data. The input stripe data and its position data 1 and 2 are temporarily stored in the storage device 52.

Here, the reference image data is generated in the frame region size, whereas the stripe data is larger than the frame region size. Therefore, the size of reference image data is to be used.

In the division-into-frames step (S104), the division-into-frames unit 61 reads stripe data from the storage device 52, and, for each inspection stripe 20, divides a stripe region image (optical image) into a plurality of frame images (optical images) by a predetermined size (for example, the same width as the scan width W) in the x direction. For example, it is divided into frame images each having 512× 512 pixels. In other words, the stripe region image of each inspection stripe 20 is divided into a plurality of frame images (optical images) by the same width as that of the inspection stripe 20, for example, by the scan width W. Thereby, a plurality of frame images (optical images) corresponding to a plurality of frame regions are acquired. A plurality of frame images are stored in the storage device 54.

In the design data input step, the input unit 74 (an example of a design data input unit) inputs design data of a pattern formed on the target object 101 to be inspected from an external storage device 300. The input design data is temporarily stored in the storage device 76. Here, it is input from the external storage device 300 other than the inspection apparatus 100. Alternatively, when the inspection apparatus 100 performs die-to-database inspection, it is also preferable to input design data before generating reference image, from the inspection apparatus 100.

In the reference image generation step, the reference image generation unit 78 generates reference image data to be compared with optical image data (frame image) by carrying out image development of the design data. Specifically, the reference image generation unit 78 reads design data from the storage device 76, and converts (carries out image development) each figure pattern in each frame region defined in the read design data into image data of binary values or multiple values so as to generate reference image data.

Figures defined in the design data are, for example, rectangles or triangles as basic figures, as described above. For example, figure data is stored in which the shape, size, position, and the like of each pattern figure are defined as information, such as coordinates (x, y) at a reference position of a figure, the length of a side, a figure code being an identifier for identifying a figure type, such as a rectangle, triangle, or the like.

When information on a design pattern serving as such figure data is input to the reference image generation unit 78, similarly to in the development circuit 111 of the inspection apparatus 100, it is developed into data of each figure. Then, a figure code, figure dimensions and the like indicating figure shape of the figure data are interpreted. Then, design image data of binary values or multiple values is developed and output as a pattern arranged in a grid which is a unit of a predetermined quantization size grid. In other words, design data is loaded, and an occupancy rate of a figure in a design pattern is calculated for each grid obtained by virtually dividing an inspection region into grids of predetermined dimension units. Then, occupancy rate data of n bits is output. For example, it is preferable that one grid is set as one pixel. If a resolution of $1/2^8$ ($=1/256$) is given to one pixel, an occupancy rate in a pixel is calculated by assigning a small region of $1/256$, for an amount equal to the region of a figure arranged in a pixel. Then, it is output as occupancy rate data of 8 bits to the storage device 50, where position data of this image is also stored.

Although suitable filter processing is subsequently performed in the inspection apparatus 100, since a shape defect is not determined but a position deviation amount is measured in the measuring apparatus 200, such filter processing may be omitted. However, similarly to in the inspection apparatus 100, it is also preferable to be matched with measurement data by also performing filtering processing on design image data being image data of the design side whose image intensity (gray value) is represented by a digital value.

In such a case, what is necessary is to perform, in the reference image generation unit 78 or by other function, the same processing as that of the reference circuit 112 of the inspection apparatus 100.

In the positional deviation distribution generation step, the positional deviation distribution generation unit 64 measures a positional deviation amount of a pattern on the target object 101 to be inspected, by using optical image data (in this case, a frame image after dividing into frames) obtained from the inspection apparatus 100 and reference image data, so as to generate a positional deviation distribution (positional deviation map). First, position adjustment is performed for each frame region in order to measure a positional deviation amount of the entire figure pattern in a frame region. Here, the position adjustment is performed using a reference image at the position corresponding to the position indicated by position data of a frame image. In other words, the positional deviation distribution generation unit 64 generates a positional deviation distribution by further using position data of optical image data and position data of reference image data in addition to optical image data (in this case, a frame image after dividing into frames) and reference image data.

In the position adjustment step (S114), the position adjustment unit 62 performs position adjustment between each frame image in a plurality of frame images and its corresponding reference image in a plurality of reference images, and measures (calculates), for each frame image (frame region), a positional deviation amount between the frame image concerned and its corresponding reference image. The position adjustment is performed moving the entire frame region. It is preferable, for example, that the position adjustment is performed by the unit of a sub-pixel, using a least-squares method, etc. Thereby, a positional deviation error dependent upon the position of a frame region can be obtained. The calculated positional deviation amount (positional deviation amount A) of each frame region is stored in the storage device 58.

Figure 6A:
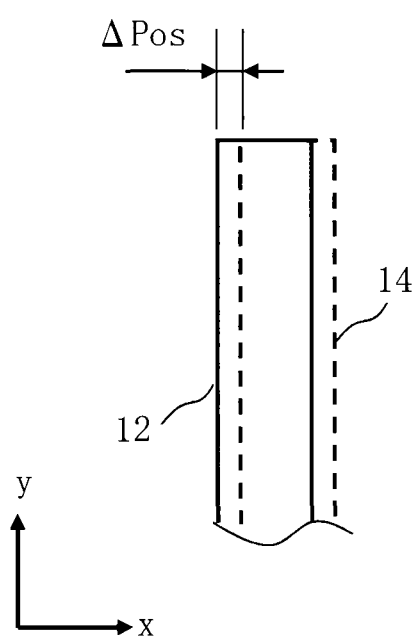
FIGS. 6A and 6B show examples of positional deviation amounts according to the first embodiment.
Figure 6B:
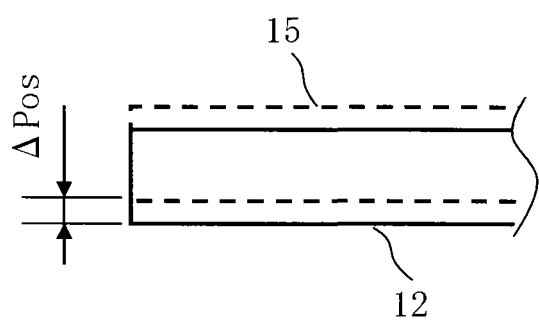

FIGS. 6A and 6B show examples of positional deviation amounts according to the first embodiment. FIG. 6A shows an example of a positional deviation amount ΔPos generated, for example, when performing position adjustment in the x direction between a pattern 12 in a frame image obtained from the target object 101 serving as an actual mask and a pattern 14 in a reference image. FIG. 6B shows an example of a positional deviation amount ΔPos generated, for example, when performing position adjustment in the y direction between the pattern 12 in a frame image obtained from the target object 101 serving as an actual mask and a pattern 15 in a reference image. Although only one figure is shown in each of the examples of FIGS. 6A and 6B, position adjustment is performed uniformly moving the entire frame region, using a frame image obtained from the target object 101 being an actual mask and a reference image. It is preferable, for example, that the position adjustment is performed by the unit of a sub pixel, using a least-squares method etc. Thereby, with respect to a line pattern and a quadrangular pattern, a positional deviation amount corresponding to a position shift amount in the x direction and a positional deviation amount corresponding to a position shift amount in the y direction can be obtained.

As to a positional deviation amount of a frame region in an x-direction line and space pattern, for example, it is sufficient to obtain just a positional deviation amount in the x direction. As to a positional deviation amount of a frame region in a y-direction line and space pattern, for example, it is sufficient to obtain just a positional deviation amount in the y direction. As to frame regions of a plurality of quadrangular patterns, it is sufficient to obtain positional deviation amounts in the x and y directions. Moreover, in many cases, since a plurality of figure patterns are arranged in a frame image, the maximum deviation amount at the most matched positional relation in the frame should be calculated.

Next, in the positional deviation map generation step, the positional deviation map generation unit 70 reads a positional deviation amount (positional deviation amount A) of each frame region from the storage device 58, and generates a positional deviation map for the entire inspection region 10 in which each positional deviation amount is a map value.

Figure 7:
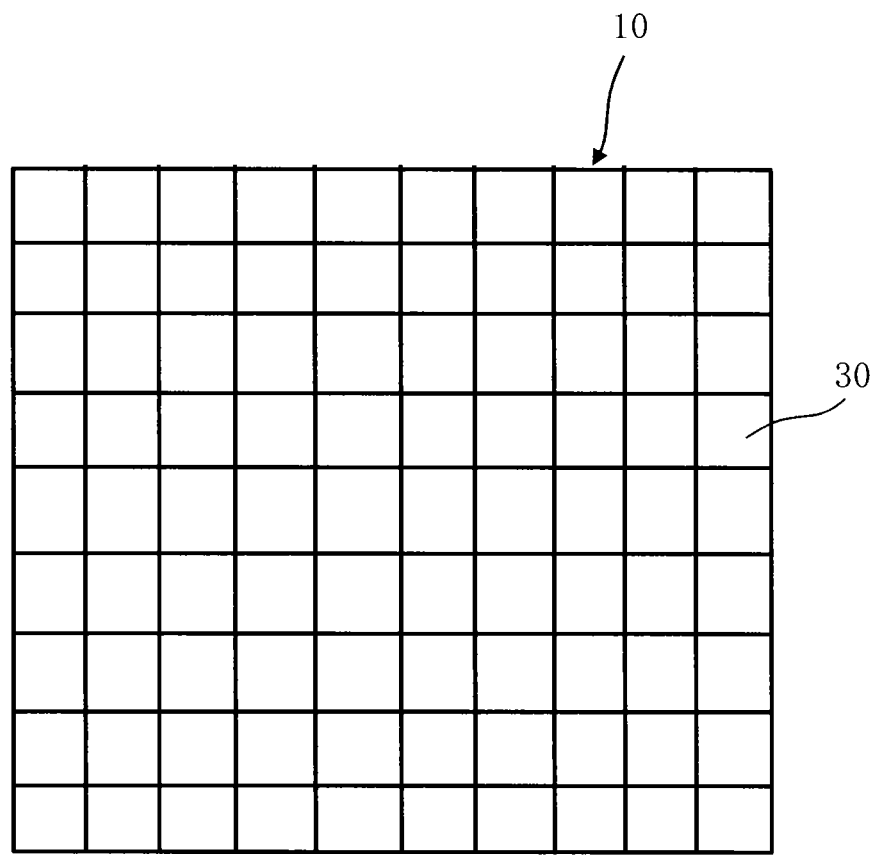
FIG. 7 shows an example of a positional deviation map according to the first embodiment.

FIG. 7 shows an example of a positional deviation map according to the first embodiment. The inspection region 10 of the target object 101 is divided into a plurality of frame regions 30, where the positional deviation amount in each frame region 30 is to be a map value of the frame region 30 concerned. Thereby, positional deviation distribution for the entire inspection region 10 of the target object 101 can be obtained.

In the output step, the output unit 72 outputs the obtained positional deviation map (positional deviation distribution) of a pattern on the inspection target object 101. For example, it is output to a magnetic disk drive, magnetic tape drive, FD, CRT, pattern monitor, or printer, which are not shown. It is also acceptable to output to the outside of the apparatus.

Here, if the position data of the optical image data is data of only one coordinate system, it is sufficient to use that position data. However, as described above, if there are two pieces of position data of different coordinate systems, it is acceptable to use only one piece of the position data. In order to achieve more highly precise measurement, it is preferable to calibrate the coordinate system as described below.

Figure 8A:
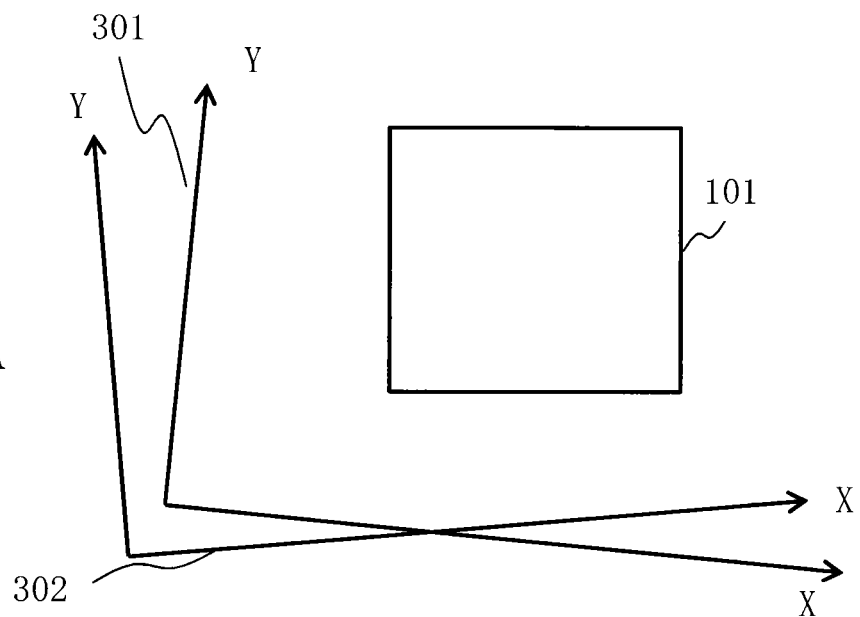
FIGS. 8A and 8B show an example of a plurality of coordinate systems and an example of calibrated coordinate systems according to the first embodiment
Figure 8B:
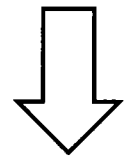
Figure 8B:
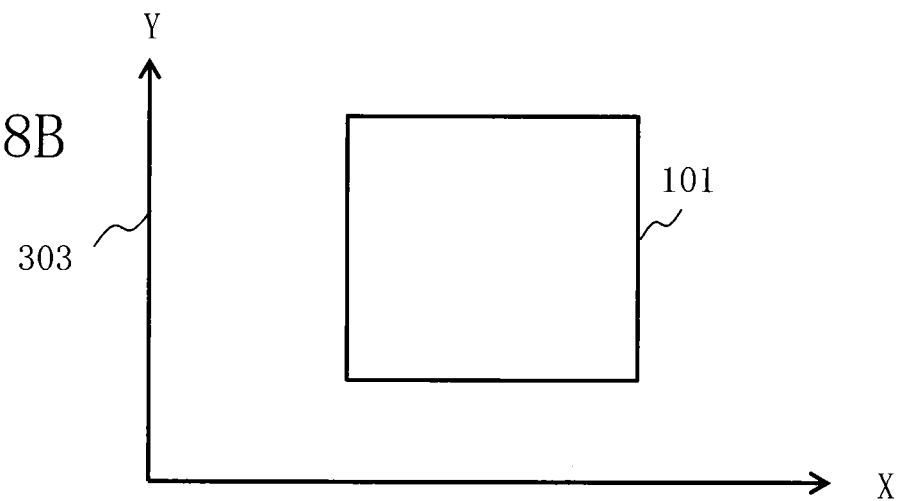

FIGS. 8A and 8B show an example of a plurality of coordinate systems and an example of calibrated coordinate systems according to the first embodiment. In FIG. 8A, as position data of optical image data, there are shown position data 1 of a coordinate system 301 measured by the linear scale measurement system 124 and position data 2 of a coordinate system 302 measured by the laser measurement system 122. As shown in FIG. 8A, the axis and origin of the coordinate system 301 differ from those of the coordinate system 302. Then, in the first embodiment, the coordinate system is calibrated using calibration data.

The input unit 60 inputs calibration data for calibrating a coordinate system. It is assumed that calibration data varies depending upon the inspection apparatus 100. Therefore, for each inspection apparatus to be used, an error between the coordinate system 301 measured by the linear scale measurement system 124 and the coordinate system 302 measured by the laser measurement system 122 is obtained in advance by an experiment etc. Then, a conversion function, a conversion table or the like for correcting such an error needs to be generated in advance using position data of both the coordinate systems. The conversion function, the conversion table, or the like serves as calibration data. Position data (x, y) after calibration can be obtained, for example, by the following equation (1) by using position data $(x_1, y_1)$ of the coordinate system 301, position data $(x_2, y_2)$ of the coordinate system 302, and a temperature t at the time of measurement.

$$x = f(x_1, y_1) + g(x_2, y_2, t)$$

$$y = f'(x_1, y_1) + g'(x_2, y_2, t) \qquad (1)$$

Since the laser measurement system 122 is affected by the temperature t, it is preferable to add the parameter of the temperature t to the conversion function used at the time of calibration.

As described above, the frame image whose position data has been calibrated is stored in the storage device 56. Then, positional deviation distribution is generated using the position data which has been calibrated using coordinate calibration data.

In the positional deviation distribution generation step, the positional deviation distribution generation unit 64 measures a positional deviation amount of a pattern on the inspection target object 101 by using optical image data (this optical image may be a frame image after dividing into frames) obtained from the inspection apparatus 100 and reference image data, so as to generate a positional deviation distribution (positional deviation map). First, position adjustment is performed for each frame region in order to measure a positional deviation amount of the entire figure pattern in a frame region. Here, the position adjustment is performed using a reference image at the position corresponding to the position indicated by calibration position data of a frame image. In other words, the positional deviation distribution generation unit 64 generates, for each frame, a positional deviation distribution by further using calibration position data of optical image data and position data of reference image data in addition to optical image data (in this case, a frame image corresponding to a predetermined position in positional deviation distribution, in a plurality of frame images after dividing into frames) and reference image data. The other processing contents are the same as those described above.

Thus, position data of a plurality of coordinate systems is used as position data of optical image data, and the position data of a plurality of coordinate systems is calibrated so as to generate position data to be used, thereby measuring a more highly precise positional deviation amount.

The number of the figure patterns formed on the target object 101 is enormous. Therefore, the data size of the frame image of the entire target object 101 is also huge. Accordingly, a huge amount of resource of the storage device is needed for keeping data of frame images and reference images of the entire target object 101, in the measuring apparatus 200. Therefore, in the first embodiment, it is preferable to input optical image data and reference image data which are generated in real time in conjunction with the inspection operation of the inspection apparatus, and to measure a positional deviation amount in conjunction with the inputting. After the measurement, the input data is to be overwritten by the next data. Thereby, the resource of the storage device in the measuring apparatus 200 can be made substantially small.

As described above, according to the first embodiment, the tendency of positional deviation of patterns formed on the target object to be inspected can be acquired by utilizing data obtained in the pattern inspection apparatus. Further, as described above, when die-to-die inspection is performed in the pattern inspection apparatus, if design data is input from a device other than the pattern inspection apparatus, the tendency of positional deviation of patterns formed on the target object to be inspected can be acquired by utilizing data obtained for the die-to-die inspection.

Referring to specific examples, embodiments have been described above. However, the present invention is not limited to these examples. For example, the transmission illumination optical system which uses a transmitted light is described as the illumination optical system 170 in the embodiments, but it is not limited thereto. For example, it may be a reflection illumination optical system which uses a reflected light. Alternatively, it is also preferable to simultaneously use a transmitted light and a reflected light by combining the transmission illumination optical system and the reflection illumination optical system.

Moreover, as to the positional deviation map described above, it is also preferable to sort and display map values by color for each predetermined range. Thereby, a contour line map of a positional deviation amount can be obtained. It is also acceptable to generate a contour line map in the same color.

Although in the example described above, the positional deviation amount is calculated for each frame image while uniformly shifting the entire inside of an image, it is not limited thereto. It is also preferable to calculate a positional deviation amount of each figure pattern in an image, and to obtain a map value by calculating an average value, a median value, a maximum value, or a minimum value of the positional deviation amount.

Moreover, although in the example described above, the measuring apparatus 200 inputs stripe data before dividing into frame images, it is not limited thereto. The measuring apparatus 200 may input frame images after being divided in the inspection apparatus 100.

While the apparatus configuration, control method, and the like not directly necessary for explaining the present invention are not described, some or all of them may be suitably selected and used when needed. For example, although description of the configuration of a control unit for controlling the inspection apparatus 100 is omitted, it should be understood that some or all of the configuration of the control unit is to be selected and used appropriately when necessary.

In addition, any other pattern inspection apparatus, pattern inspection method, measuring apparatus and measuring method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A measuring apparatus comprising:
   an optical image input unit configured by a circuit or a computer, to acquire optical image data of a figure pattern obtained by an external pattern inspection apparatus, which inspects a defect of a pattern formed on a target object to be inspected by scanning an inspection region of the target object to be inspected, from the external pattern inspection apparatus, wherein the measuring apparatus is arranged independently from the external pattern inspection apparatus, outside the external pattern inspection apparatus;
   a design data input unit configured by a circuit or the computer, to acquire design data of the pattern formed on the target object to be inspected;
   a reference image generation unit configured by a circuit or the computer, to generate reference image data to be compared with the optical image data, by carrying out image development of the design data, independently from an inspection of the defect of the pattern performed by the external pattern inspection apparatus;
   a positional deviation distribution generation unit configured by a circuit or the computer, to generate positional deviation distribution by measuring a positional deviation amount of the pattern on the target object to be inspected, by using the optical image data obtained from the external pattern inspection apparatus and the reference image data having been generated, independently from an inspection of the defect of the pattern performed by the external pattern inspection apparatus; and
   an output unit configured by a circuit or the computer, to output generated positional deviation distribution of the pattern on the target object to be inspected, independently from an inspection of the defect of the pattern performed by the external pattern inspection apparatus, wherein
   the optical image input unit further acquires, from the external pattern inspection apparatus, the optical image data together with position data of the optical image data, which is obtained by the external pattern inspection apparatus while the optical image data is also obtained by the external pattern inspection apparatus, and
   the positional deviation distribution generation unit generates the positional deviation distribution by further using the position data of the optical image data which has been acquired.

2. The apparatus according to claim 1, wherein as position data of the optical image data, position data of a plurality of coordinate systems are used, the plurality of coordinate systems including a coordinate system measured by a linear scale measurement system and a coordinate system measured by a laser measurement system.

3. The apparatus according to claim 2, wherein
   the optical image input unit further acquires coordinate calibration data for calibrating the plurality of coordinate systems, and
   the positional deviation distribution generation unit generates the positional deviation distribution by using position data which has been calibrated using the coordinate calibration data.

4. The apparatus according to claim 1, wherein the positional deviation distribution generation unit measures the positional deviation amount, in conjunction with an inspection operation of the external pattern inspection apparatus which inspects the defect of the pattern formed on the target object.

5. The apparatus according to claim 1, wherein the inspection region of the target object to be inspected is virtually divided into a plurality of stripe regions each being strip-shaped, in a direction orthogonal to a scanning direction scanned by the external pattern inspection apparatus,
   the external pattern inspection apparatus acquires stripe data of a stripe region image with respect to each of the plurality of stripe regions, and
   the optical image input unit acquires the stripe data,
   further comprising:
   a first storage device configured to store the stripe data having been acquired;
   a second storage device configured to store the reference image data having been acquired; and
   a division-into-frames unit configured by a circuit or the computer, to read the stripe data from the first storage device, and divide the stripe region image into a plurality of frame images by a predetermined size in the scanning direction, for the each of the plurality of stripe regions, wherein the positional deviation distribution generation unit generates the positional deviation distribution for each frame image region of the plurality of frame images.

6. The apparatus according to claim 5, wherein the positional deviation distribution generation unit includes a position adjustment unit configured to perform position adjustment between each frame image in the plurality of frame images and a corresponding reference image, and to measure, for the each frame image, a positional deviation amount between the each frame image concerned and the corresponding reference image.

7. The apparatus according to claim 6, wherein the positional deviation distribution generation unit includes a positional deviation map generation unit configured to generate, as the positional deviation distribution, a positional deviation map for a whole of the inspection region by using the positional deviation amount of the each frame image of the plurality of the frame images, the positional deviation amount in each frame image region is to be a map value of a frame image region concerned in the positional deviation map.

8. A measuring method comprising:

acquiring, by using a measuring apparatus, optical image data of a figure pattern obtained when an external pattern inspection apparatus, which inspects a defect of a pattern formed on a target object to be inspected, scans an inspection region of the target object to be inspected, wherein the measuring apparatus is arranged independently from the external pattern inspection apparatus, outside the external pattern inspection apparatus;

acquiring, by using the measuring apparatus, design data of the pattern formed on the target object to be inspected;

generating reference image data to be compared with the optical image data, by carrying out image development of the design data, by using the measuring apparatus, independently from an inspection of the defect of the pattern performed by the external pattern inspection apparatus;

generating, by using the measuring apparatus, positional deviation distribution by the measuring apparatus, by measuring a positional deviation amount of the pattern on the target object to be inspected, by using the optical image data obtained from the external pattern inspection apparatus and the reference image data having been generated, independently from an inspection of the defect of the pattern performed by the external pattern inspection apparatus; and outputting, by using the measuring apparatus, generated positional deviation distribution of the pattern on the target object to be inspected, from the measuring apparatus, independently from an inspection of the defect of the pattern performed by the external pattern inspection apparatus, wherein the acquiring acquires, from the external pattern inspection apparatus the optical image data together with position data of the optical image data, which is obtained by the external pattern inspection apparatus while the optical image data is also obtained by the external pattern inspection apparatus, and the positional deviation distribution is generated by using the position data of the optical image data.

9. A measuring apparatus comprising:

optical image data input means for acquiring optical image data of a figure pattern obtained by an external pattern inspection apparatus, which inspects a defect of a pattern formed on a target object to be inspected by scanning an inspection region of the target object to be inspected, from the external pattern inspection apparatus, wherein the measuring apparatus is arranged independently from the external pattern inspection apparatus, outside the external pattern inspection apparatus;

design data input means for acquiring design data of the pattern formed on the target object to be inspected;

reference image generation means for generating reference image data to be compared with the optical image data, by carrying out image development of the design data, independently from an inspection of the defect of the pattern performed by the external pattern inspection apparatus;

positional deviation distribution generation means for generating positional deviation distribution by measuring a positional deviation amount of the pattern on the target object to be inspected, by using the optical image data obtained from the external pattern inspection apparatus and the reference image data having been generated, independently from an inspection of the defect of the pattern performed by the external pattern inspection apparatus; and output means for outputting generated positional deviation distribution of the pattern on the target object to be inspected, wherein the measuring apparatus is arranged independently from the external pattern inspection apparatus, independently from an inspection of the defect of the pattern performed by the external pattern inspection apparatus, wherein the optical image input means further acquires, from the external pattern inspection apparatus, the optical image data together with position data of the optical image data, which is obtained by the external pattern inspection apparatus while the optical image data is also obtained by the external pattern inspection apparatus, and the positional deviation distribution generation means generates the positional deviation distribution by further using the position data of the optical image data which has been acquired.

* * * * *